(12) United States Patent
Wang et al.

(10) Patent No.: US 7,159,145 B2
(45) Date of Patent: Jan. 2, 2007

(54) BUILT-IN SELF TEST SYSTEM AND METHOD

(75) Inventors: Li Wang, LaGrangeville, NY (US); Vasudev Dasappa, Bangalore (IN); Thomas Boehler, Ottobrunn (DE)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 550 days.

(21) Appl. No.: 10/435,842

(22) Filed: May 12, 2003

(65) Prior Publication Data

US 2004/0230870 A1 Nov. 18, 2004

(51) Int. Cl.
*G06F 11/00* (2006.01)

(52) U.S. Cl. .............................. 714/36; 714/5; 714/30; 714/33; 714/42; 714/47; 714/718

(58) Field of Classification Search ................ 714/30, 714/36, 5, 33, 42, 47, 718
See application file for complete search history.

(56) References Cited

U.S. PATENT DOCUMENTS

| | | | |
|---|---|---|---|
| 5,961,653 A | * | 10/1999 | Kalter et al. ................... 714/7 |
| 6,388,930 B1 | | 5/2002 | Obremski |
| 6,400,619 B1 | | 6/2002 | Hsu et al. |
| 6,445,626 B1 | | 9/2002 | Hsu et al. |
| 6,452,848 B1 | | 9/2002 | Obremski et al. |
| 6,519,725 B1 | * | 2/2003 | Huisman et al. ............ 714/718 |
| 2002/0059543 A1 | * | 5/2002 | Cheng et al. .................. 714/30 |
| 2002/0199136 A1 | * | 12/2002 | Ku ................................ 714/30 |
| 2004/0049720 A1 | * | 3/2004 | Boehler ....................... 714/718 |

* cited by examiner

*Primary Examiner*—Robert Beausoliel
*Assistant Examiner*—Charles Ehne
(74) *Attorney, Agent, or Firm*—Slater & Matsil, L.L.P.

(57) ABSTRACT

External test equipment is used to simulate an internal BIST test, thus enabling the capture or generation of detailed test results. By simulating the BIST test sequence in real time during the test, the external tester may monitor an output from the BIST and determine the exact location of failures when they occur. The external tester may generate a bit fail map indicating whether each memory location passed or failed the BIST test.

20 Claims, 3 Drawing Sheets

BUILT-IN SELF TEST SYSTEM AND METHOD

TECHNICAL FIELD

The present invention relates generally to a system and method for built-in self test (BIST), and more particularly to a system and method for real-time external simulation of BIST.

BACKGROUND

As Application Specific Integrated Circuit (ASIC) technologies expand into new markets, the need for denser embedded memory generally increases. For example, markets in portable and multimedia applications such as cellular phones and personal digital assistants generally demand increased density of embedded memory for higher function and lower power consumption. In order to accommodate this increased demand, embedded dynamic random access memory (eDRAM) macros have been offered in state-of-the-art ASIC portfolios. The integration of eDRAM into ASIC designs generally has intensified the focus on how best to test high-density macros, such as a complex DRAM macro, in a logic test environment.

For example, direct memory access (DMA) testing generally may be used to test conventional DRAMs, which have pads for direct control of address, data and control pins that are accessible by an external tester. The external tester may directly manipulate the DRAM inputs and monitor the outputs for testing. Direct access testing for embedded eDRAM, or other types of embedded RAM such as embedded magnetic RAM (MRAM) and embedded flash RAM, however, generally is too costly in terms of silicon area, available input/output (I/O) pins, wiring complexity and test time. For example, with embedded RAM, the only access to the RAM generally is through the system application in which the RAM is embedded. To require the application to also function as the tester generally may require extra memory storage or extra I/O pins for external access.

Generally, a preferred solution to the embedded-device test problem is the use of a built-in self test (BIST) system that implements elements sufficient for high-fault coverage on DRAM. Such elements may include, for example, the calculation of a two-dimensional redundancy solution, pattern programming flexibility, real-time or at-speed testing, and test mode application for margin testing. The development of BIST capabilities generally has allowed the testing of large, embedded memories on logic testers without the added die area or performance testing inaccuracies associated with, e.g., isolation multiplexers.

Generally, the BIST is a relatively simple circuit (although it may be complicated) that functions like a small tester on the semiconductor chip or integrated circuit. The BIST may be designed to have partial or full access to the embedded RAM, while the external automated test equipment generally has only very limited access to the chip, and relies on the BIST to carry out the detailed testing of the memory. The BIST may test only the core memory component because the chip's logic circuitry may be tested by a separate logic tester.

Because the BIST is on the die and can directly control the embedded RAM, a designer may design various levels of functionality between the BIST and the actual device circuitry, such as different test modes. To test the embedded RAM, the external tester may send a command to the BIST to initiate a test. Generally, when the BIST completes the test, it returns to the external tester a value indicating whether the device passed or failed the test. For example, a logic 0 may indicate that the DRAM passed the test and a logic 1 may indicate that the DRAM failed the test, or vice versa.

One potential drawback associated with existing BIST implementations is that there is only limited information from the BIST test available externally to the chip. Generally, the external tester may be used only for initial BIST test program vector and clock input, and for monitoring the very limited BIST output, such as a fail flag pin and an end-of-test (EOT) pin. Generally, once a test is initiated, the on-chip BIST internally generates addresses and data patterns sent to the embedded RAM, and internally compares data returned from the embedded RAM. If the device fails the test, then the BIST may flag the failure on a designated external pin, such as by setting the fail signal to a logic one to indicate a fail, or hold a logic zero to indicate a pass.

From the perspective of the external tester, the only information received from the BIST is whether the entire test was passed or failed by the device. In other words, the external tester receives the same result regardless of whether a single memory address on the chip fails, or the entire memory array fails, and the external tester cannot distinguish between the two, nor pinpoint the cause of the failure.

SUMMARY OF THE INVENTION

These and other problems are generally solved or circumvented, and technical advantages are generally achieved, by preferred embodiments of the present invention which utilize external test equipment to simulate the internal BIST test, thus enabling the capture or generation of detailed test results. By simulating the BIST test sequence in real time during the test, the external tester may monitor an output from the BIST and determine the exact location of failures when they occur. The external tester may generate a bit fail map to indicate whether each memory location passed or failed the BIST test.

In accordance with a preferred embodiment of the present invention, a method for testing an embedded memory core on a semiconductor chip comprises providing a clock to a BIST circuit on the semiconductor chip, initializing the BIST circuit to perform a built in self test of the embedded memory core using an address sequence, starting a simulation of the built in self test, wherein the simulation simulates the address sequence and wherein the simulation uses the clock to run synchronously with the BIST circuit test, monitoring an output from the BIST circuit for an indication that a memory cell failed the built in self test, and if there is a memory cell failure, correlating the memory cell failure with a specific address generated by the simulation.

In accordance with another preferred embodiment of the present invention, a system for testing an embedded memory core on a semiconductor chip having BIST circuitry comprises a simulated test program having a control interface for initializing and clocking the BIST circuitry on the semiconductor chip, an address generator for generating a first address sequence matching a second address sequence generated by the BIST circuitry during a built in self test of the embedded memory core, wherein the address generator receives clocking information from the simulated test program for synchronizing the first address sequence with the second address sequence, and data input nodes for receiving data out bus signals from the BIST circuitry during the built in self test of the embedded memory core, wherein the data out bus signals indicate whether individual memory cells failed the built in self test, and wherein the test system is adapted to correlate a specific memory cell failure with a corresponding address generated by the address generator.

In accordance with another preferred embodiment of the present invention, a semiconductor chip comprises an embedded memory core comprising an array of memory cells, a BIST circuit coupled to the memory core and comprising circuitry for testing the memory cells in the memory core, and signal lines coupled between the BIST circuit and externally accessible nodes, wherein the signal lines comprise a data out bus, and wherein the BIST circuit is configured to provide, on the data out bus, test pass/fail data corresponding to individual ones of the memory cells that are tested with a built in self test.

An advantage of a preferred embodiment of the present invention is that it provides detailed information about the embedded memory core instead of just a single fail or pass. A bit fail map may be generated from a BIST test. The detailed information may indicate precisely where the fail or fails are occurring and just how much of the device is failing.

Another advantage of a preferred embodiment of the present invention is that it enables economical embedded memory testing because a manufacturer does not need to build a through pad memory test macro for line monitoring. The actual product with BIST may be used as the line monitor for detecting embedded memory defects.

Another advantage of a preferred embodiment of the present invention is that it allows at-speed testing of the embedded memory. The clock from the tester may be run at high speed to provide a realistic test of the device.

Another advantage of a preferred embodiment of the present invention is that it may be used to check and verify the BIST itself. A defect may be intentionally created on a test chip, and then the BIST may be instructed to perform a test. The bit fail map generated from the test may be compared to the actual failure to ensure that the BIST is operating properly. A preferred embodiment of the present invention may also be used to check the address scrambling operations, e.g., the physical address and logic address transformations or conversions, of the BIST.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. For example, the embodiment described in detail below relates to BIST for an embedded DRAM core, but the invention may be utilized with other embedded circuits, such as other types of embedded memories, or other limited-access circuits on an ASIC.

Figure 1:
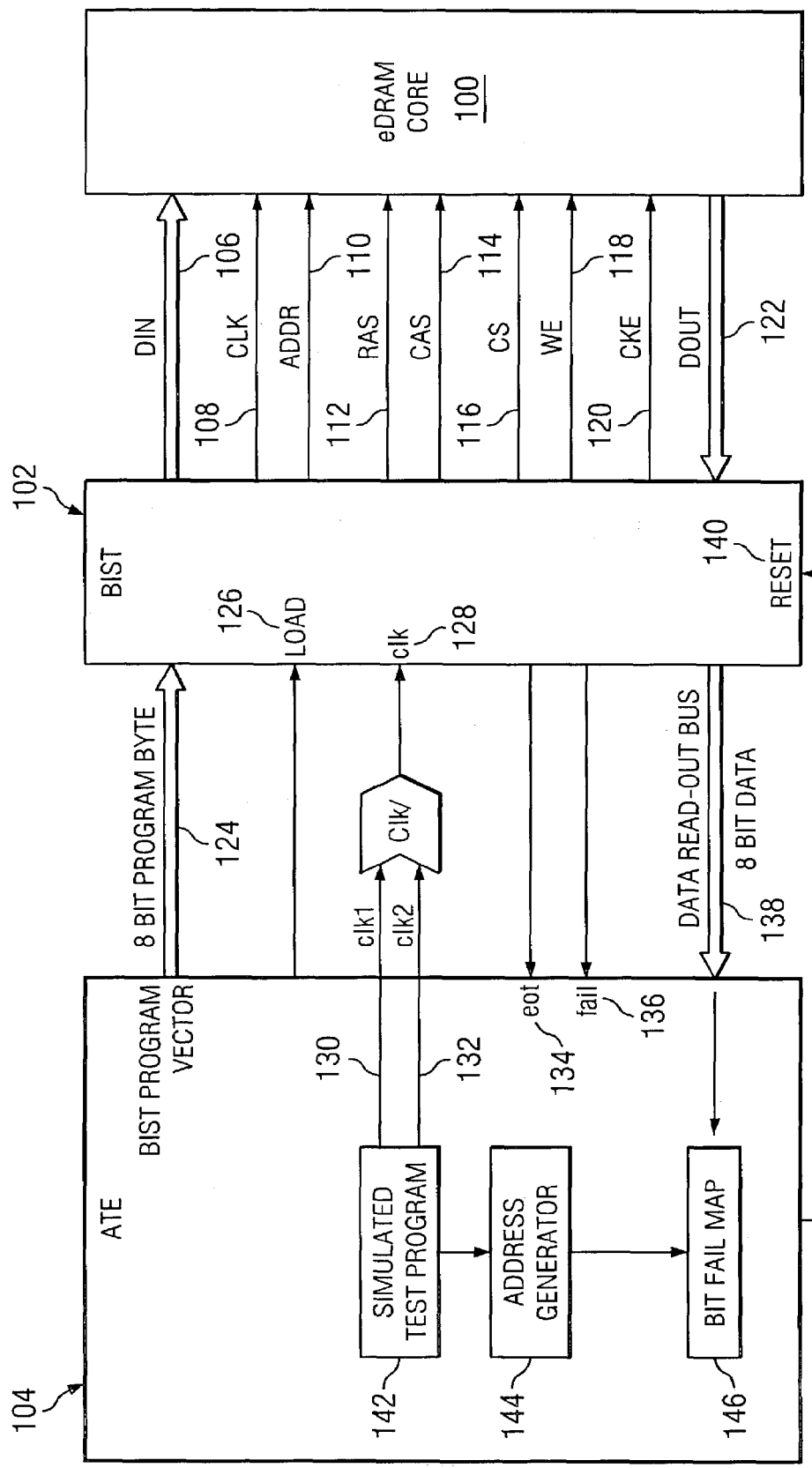
FIG. 1 is a block diagram of a BIST system for testing an eDRAM core.

FIG. 1 is a block diagram illustrating a test configuration in accordance with a preferred embodiment of the present invention. Embedded DRAM core 100 and BIST 102 are located on a semiconductor chip or die connected to automated test equipment ("ATE") 104. Generally, full access to eDRAM core 100 is available on-chip, and only limited access is available to external test equipment. eDRAM core 100 has standard interface signals for a memory, including core data in lines 106, clock 108, address lines 110, row address strobe 112, column address strobe 114, chip select 116, write enable 118, clock enable 120, and core data out lines 122. In other embodiments, eDRAM core 100 may have more, less, or different interface signals for controlling the memory.

BIST 102 may use the interface signals for controlling the operation and monitoring of eDRAM core 100 during a test. BIST 102 in turn has externally available signals for interfacing with ATE 104. Program vector input 124 is used by ATE 104 to provide a test vector to BIST 102. Program vector 124 may be used to initialize a test by selecting the specific test for BIST 102 to run. ATE 104 may signal the loading of program vector 124 and the actual start of the test by BIST 102 with load signal 126. The test of the embedded memory is preferably performed as a pre-fuse test. ATE 104 also provides a differential clock to BIST 102 with clock signals clock1 130 and clock2 132. BIST clock 128 is derived from these clock signals. ATE 102 may also provide a reset signal 140 to BIST 102 for resetting the BIST circuitry.

BIST 102 may signal the end of a test to ATE 104 with end of test signal 134, and may signal the failure of a test with fail signal 136. BIST 102 may also provide data read-out bus 138 to ATE 104. Data out bus 138 may be any number of lines, but preferably is the same size as the core data out bus 122 from eDRAM core 100. Data out bus 138 may be used to indicate a specific failure to ATE 104, which may use this information to determine the specific location of the failure.

The external tester may be fully or semi-automated. Preferably, ATE 104 controls the initiation of a test, and monitors signals from BIST 104 for the occurrence of a failure during a test. ATE 104 comprises simulated test program 142, which simulates the test performed by BIST 102 while BIST 102 is performing the test. Based on the simulated BIST program, address generator 144 generates addresses in the same sequence as the actual BIST, in synchronization with BIST 102. As addresses are being generated, ATE 104 monitors data out bus 138 for a fail indication. If data out bus 138 indicates a fail, ATE 104 matches the fail with the corresponding address generated by address generator 144, and marks the specific location of the fail in bit fail map 146.

Figure 2:
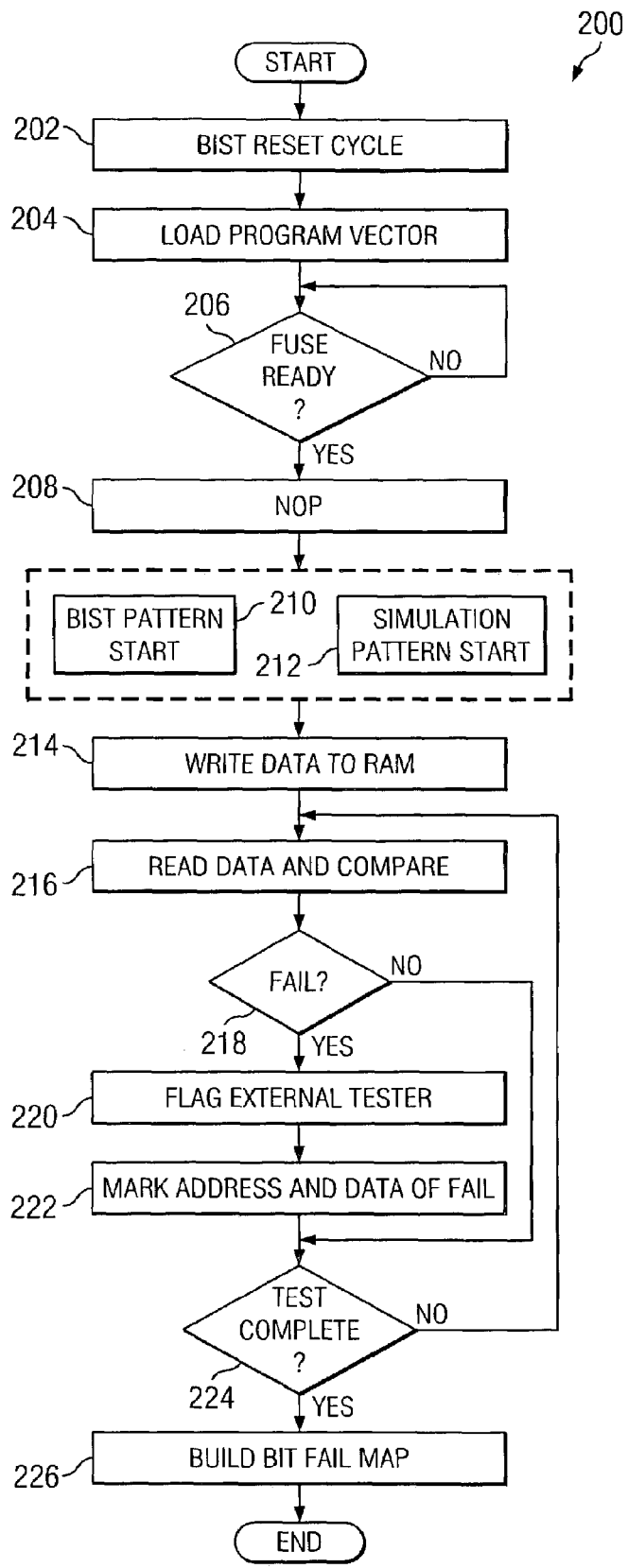
FIG. 2 is a flow chart showing the operation of the BIST system from FIG. 1.

Flow chart 200 in FIG. 2 illustrates the typical operation of the BIST test in accordance with a preferred embodiment of the present invention. ATE 104 provides the clock to BIST 102, so that ATE 104 can synchronize with the timing of BIST 102 operation during a test. Preferably, the clock may be run at the normal clock speed of the semiconductor chip. Depending on the testing parameters, the clock alternatively may be run slower or even faster than normal clock speed. First, a BIST reset cycle 202 is initiated by ATE 104 using reset signal 140. After the reset cycle is complete, ATE 104 executes step 204 by loading a program vector or instruction 124 into a BIST memory or register using load signal 126. Step 206 waits for the fuse ready signal to activate, and after it does, a no operation ("NOP") is executed to delay one cycle.

BIST pattern start 210 and ATE simulation pattern start 212 begin execution in a synchronous manner. That is, the external simulation matches or follows the BIST pattern cycle for cycle. The same test program run by the BIST may be simulated by the external tester by following the same address test sequence.

Figure 3:
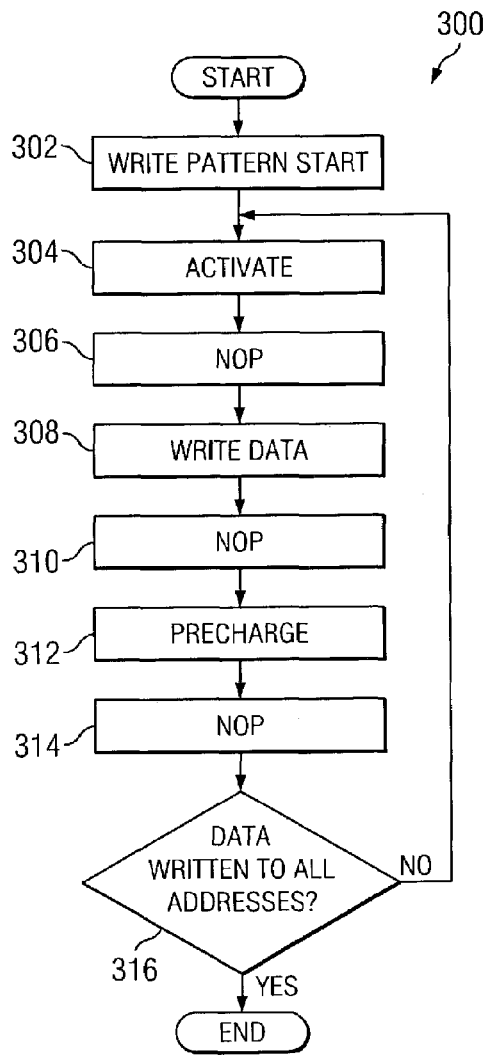
FIG. 3 is a flow chart of the BIST data write to the eDRAM core.

Next, in step 214, BIST 102 writes data to all of the memory cells to be tested in memory core 100. A preferred embodiment BIST write pattern sequence 300 is shown in more detail in FIG. 3. Write pattern start begins in step 302. BIST 102 then performs a loop until the cells at all addresses to be tested are written with data. In the loop, the BIST performs the following sequence: activate 304, NOP 306, write data 308, NOP 310, precharge 312, and NOP 314. Instep 316, the BIST determines whether the data write pattern is complete. If not, the BIST executes the sequence for the next address. If the write pattern has been completed, the sequence continues in FIG. 2.

Figure 4:
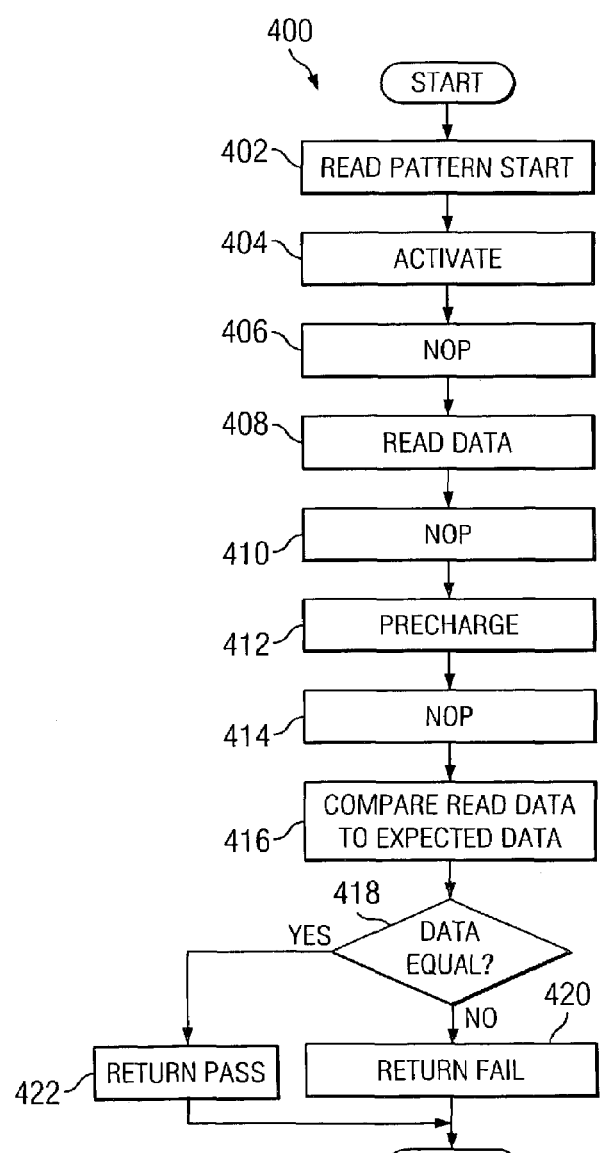
FIG. 4 is a flow chart of a BIST read data and compare cycle.

Referring back to FIG. 2, after the write data sequence is complete, BIST 102 begins testing the memory core 100 in step 216 by reading data and comparing it to the data written to the respective memory locations. A preferred embodiment BIST read pattern sequence 400 is shown in more detail in FIG. 4. Read pattern start begins in step 402. With the exception of reading data instead of writing data, the initial portion of a read follows a similar sequence to that of a write: activate 404, NOP 406, read data 408, NOP 410, precharge 412, and NOP 414. After this sequence is completed, the BIST compares the read data to the expected value from the write cycle for that address in step 416. If the data is equal or valid as determined in step 418, the read sequence returns a pass for that address in step 422. If the data is not equal, the read sequence returns a fail for that address in step 420.

Referring back to FIG. 2, the pass or fail returned from the read sequence is checked in step 218. If there is no fail, the test continues on to step 224. If there is a fail, the BIST signals the fail to the external tester in step 220. In a preferred embodiment, the failure is sent to the external tester via data out bus 138. The BIST engine uses a set of data output nodes or pins to the external tester for signaling memory cell failures, which nodes are preferably the DQ pins. The data out bus is preferably 8 bits wide, but alternatively may be 16 or 32 or more bits wide, or may be less than 8 bits wide. Generally, each pin represents one memory cell. The output from these pins is logic zero if the addressed cells passed the read cycle test. If an addressed cell fails the test, however, the corresponding data pin is set to logic one for fail detection by the external tester.

Upon detecting a fail, the external tester registers the address and data pin associated with the fail in step 222. As the BIST is executing a test of the embedded memory core, the external tester is executing a simulation of the test, running the same address sequence as the BIST. The external tester generates independent address information with address generator 144 so that as data is received from the BIST, the tester may associate it with the corresponding address location. The BIST address sequence and data out, and the external address generation are synchronized to the same clock generated by the external tester. The tester detects the data out pin state during each valid data cycle. If the data is logic 0, it means the addressed cell passed the test. If the BIST output data is logic one, it means the addressed cell failed the test. The external tester registers the fail locations and may construct a bit fail map for the memory core using the address data and the output data received from the BIST.

Step 224 determines whether the test is complete, i.e., whether all memory cells to be tested have been tested. If not, the read cycle is repeated. If the test is complete, the external tester completes the generation of the bit fail map for the embedded memory. The BIST may use the end of test signal to indicate to the external tester that the test is complete. The BIST may also use the fail pin at that time to indicate whether the chip has passed or failed the overall test.

As an alternative, instead of or in addition to monitoring the data out bus for failures, the external tester may capture a fail by monitoring the fail flag pin during a BIST test. If the fail signal is a logic one after a read cycle, the external tester may capture the fail data from the DQ pins, and register the address information from its address generator, for use in constructing a bit fail map.

After the BIST test is done and the bit fail map is constructed, the map may be stored in a database. The bit fail map may be compiled and stored as the test is run, or may be compiled and stored after the test is complete. The bit fail map may be presented in textual or graphical output. Generally, a bit fail map may provide very useful and detailed information about the embedded memory. For example, the bit fail map may assist in distinguishing between defects introduced by the chip design or by the operation of the product line.

Although the present invention and its advantages have been described in detail, it should be understood that various changes, substitutions and alterations can be made herein without departing from the spirit and scope of the invention as defined by the appended claims. For example, many of the features and functions discussed above can be implemented in software, hardware, or firmware, or a combination thereof. As another example, it will be readily understood by those skilled in the art that the order of the steps described herein may be varied while remaining within the scope of the present invention. In particular, the writing of data to all of the memory cells may be performed first, followed by the reading and comparing of data from all of the memory cells. Alternatively, the writing and reading of data may be alternated in some fashion. As another example, logic values may be active high and inactive low, or vice versa. As yet another example, the clock may be provided from within the external tester, or may be generated separately and provided to both the external tester and the BIST.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A test system for testing an embedded memory core on a semiconductor chip having built in self test (BIST) circuitry, the test system comprising:
   a simulated test program having a control interface for initializing and clocking the BIST circuitry on the semiconductor chip;
   an address generator for generating a first address sequence matching a second address sequence generated by the BIST circuitry during a built in self test of the embedded memory care, wherein the address generator receives clocking information from the simulated test program for synchronizing the first address sequence with the second address sequence; and
   data input nodes for receiving data out bus signals from the BIST circuitry during the built in self test of the embedded memory core, wherein the data out bus signals indicate whether individual memory cells failed the built in self test, and wherein the test system is adapted to correlate a specific memory cell failure with a corresponding address generated by the address generator.

2. The test system of claim 1, wherein the control interface further comprises a program vector output and a load signal for initializing the BIST circuitry.

3. The test system of claim 1, further comprising an end of test input coupled to the BIST circuitry.

4. The test system of claim 1, further comprising a fail signal input coupled to the BIST circuitry, the fail signal configured to indicate whether the semiconductor chip passed or failed a built in self test.

5. The test system of claim 1, wherein the data out bus is eight bits wide.

6. The test system of claim 1, wherein the test system uses the memory cell failure information and the address generation to generate a bit fail map for the embedded memory core.

7. A semiconductor chip comprising:
   an embedded memory core comprising an array of memory cells;
   a built in self test (BIST) circuit coupled to the memory core and comprising circuitry for testing the memory cells in the memory core; and
   signal lines coupled between the BIST circuit and externally accessible nodes, wherein the signal lines comprise a data out bus composed of the chip's DO data bus, and wherein the BIST circuit is configured to provide, on the data out bus, test pass/fail data corresponding to individual ones of the memory cells that are tested with a built in self test as the respective individual ones of the memory cells are tested.

8. The semiconductor chip of claim 7, wherein the BIST circuit is coupled to the embedded memory core with an interface comprising memory data in, memory data out, memory clock and memory control signals.

9. The semiconductor chip of claim 7, wherein the data out bus is eight bits wide.

10. The semiconductor chip of claim 7, wherein the signal lines coupled between the external nodes and the BIST circuit further comprise a program vector input, a program vector load signal, and a clock signal input to the BIST circuit.

11. The semiconductor chip of claim 7, wherein the signal lines coupled between the external nodes and the BIST circuit further comprise an end of test signal output from the BIST circuit.

12. The semiconductor chip of claim 7, wherein the signal lines coupled between the external nodes and the BIST circuit further comprise a fail signal from the BIST circuit, the fail signal configured to indicate whether the semiconductor chip passed or failed a built in self test.

13. The semiconductor chip of claim 7, wherein the embedded memory core is en embedded dynamic random access memory (eDRAM) core.

14. A method of testing an embedded memory core on a semiconductor chip, the method comprising:
   providing a clock to a built in self test (BIST) circuit on the semiconductor chip;
   initializing the BIST circuit to perform a built in self test of the embedded memory core using an address sequence;
   starting a simulation of the built in self test, wherein the simulation simulates the address sequence and wherein the simulation uses the dock to run synchronously with the BIST circuit test;
   monitoring an output from the BIST circuit for an indication tat a memory cell failed the built in self test; and
   if there is a memory cell failure, correlating the memory cell failure with a specific address generated by the simulation.

15. The method of claim 14, wherein the monitoring the output from the BIST circuit comprises monitoring a data output bus from the BIST for the fail indication.

16. The method of claim 14, wherein the monitoring the output from the BIST circuit comprises monitoring a fail signal from the BIST for the fail indication.

17. The method of claim 14, further comprising generating a bit fail map from results of the built in self test of the embedded memory core.

18. The method of claim 14, wherein the built in self test comprises first writing data to all memory cells to be tested then reading data from the memory cells and comparing the read data to the write data.

19. The method of claim 14, wherein the built in self test comprises alternating writing and reading data to and from memory cells in the memory core.

20. The method of claim 14, further comprising ending the simulation when an end of test signal is received from the BIST circuit.

* * * * *

UNITED STATES PATENT AND TRADEMARK OFFICE
CERTIFICATE OF CORRECTION

PATENT NO. : 7,159,145 B2  Page 1 of 1
APPLICATION NO. : 10/435842
DATED : January 2, 2007
INVENTOR(S) : Wang et al.

It is certified that error appears in the above-identified patent and that said Letters Patent is hereby corrected as shown below:

Column 7, line 21; delete "care" insert --core--
Column 7, line 56; delete "DO" insert --DQ--
Column 8, line 33; delete "dock" insert --clock--
Column 8, line 36; delete "tat" insert --that--

Signed and Sealed this

Third Day of April, 2007

JON W. DUDAS
*Director of the United States Patent and Trademark Office*